US006985344B2

(12) United States Patent
Marino et al.

(10) Patent No.: US 6,985,344 B2
(45) Date of Patent: Jan. 10, 2006

(54) POLLING LOOP SHORT AND OVERLOAD ISOLATOR (VSOI)

(75) Inventors: Francis C. Marino, Dix Hills, NY (US); Jon C. Bruns, Central Islip, NY (US); Jean U. Millien, Massapequa, NY (US)

(73) Assignee: Honeywell International, Inc., Morristown, NJ (US)

( * ) Notice: Subject to any disclaimer, the term of this patent is extended or adjusted under 35 U.S.C. 154(b) by 262 days.

(21) Appl. No.: 10/247,155

(22) Filed: Sep. 19, 2002

(65) Prior Publication Data

US 2004/0057181 A1 Mar. 25, 2004

(51) Int. Cl.
*H02H 9/08* (2006.01)

(52) U.S. Cl. ...................................... 361/100; 361/93.9

(58) Field of Classification Search ............ 361/62–69, 361/71, 79, 93.7, 93.8, 93.9, 100, 101, 102, 361/103; 323/235–238
See application file for complete search history.

(56) References Cited

U.S. PATENT DOCUMENTS 4,831,484 A * 5/1989 Bruch ........................ 361/101
5,216,352 A * 6/1993 Studtmann et al. ......... 323/241
5,910,875 A * 6/1999 Tian et al. .................... 361/78
6,081,123 A * 6/2000 Kasbarian et al. .......... 324/521
6,141,195 A * 10/2000 Buhring et al. ............... 361/67
6,175,220 B1 * 1/2001 Billig et al. ................ 323/239
6,678,829 B1 * 1/2004 Teggatz et al. ............. 713/300

OTHER PUBLICATIONS

National Semiconductor, "Power MOSFET Driver with Lossless Protection", dated Apr. 1995.
Hochiki America Corporation, "Installation Instructions For The DCP-SCI Short Circuit Isolator Module", dated Jun. 2001.
Science Services Laboratory, "Fire & Safety Products (A/Asia) Pty. Ltd.," Short Circuit Isolator: CHQ-SCI-S, dated Aug. 1999.

* cited by examiner

*Primary Examiner*—Brian Sircus
*Assistant Examiner*—Danny Nguyen
(74) *Attorney, Agent, or Firm*—Scully, Scott, Murphy & Presser

(57) ABSTRACT

A Vplex polling loop device is disclosed which can automatically detect and isolate shorted or overloaded sections of a polling loop, before or after polling loop power and signaling is switched to the output of the device, permitting normal operation of the remaining portion of the polling loop. The Vplex short and overload isolator (VSOI) is usable on former, existing, and future polling loop systems without the need for any software or hardware changes to the associated controls, and may also be used on 2-wire DC voltage distribution systems within the voltage and current limits of the VSOI. It is capable of multiple use anywhere on a polling loop while requiring minimum power from the polling loop. Finally, in the process of detecting and isolating a short or overload on its output, it prevents that short or overload from causing other VSOI devices on the loop to erroneously disconnect their protective branches of the loop.

22 Claims, 3 Drawing Sheets

VPLEX CONTROL
Polling Loop Out
IN VSOI-A Com OUT Com
IN VSOI-x Com OUT Com
Major Branch
Li
IN VSOI-A1 Com OUT Com
IN VSOI-A2 Com OUT Com
IN VSOI-An Com OUT Com
IN VSOI-x1 Com OUT Com
IN VSOI-x2 Com OUT Com
IN VSOI-xn Com OUT Com
Minor Branch
Vplex device
A

POLLING LOOP SHORT AND OVERLOAD ISOLATOR (VSOI)

BACKGROUND OF THE INVENTION

When a permanent break occurs in one of the branches of a polling loop 2 wire cable, the devices which are affected are easily identified and enunciated by the security system control making it relatively simple for a service person to locate and repair the break. However, if a permanent short circuit or severe overload condition occurs on the polling loop, all of the devices on that loop can no longer communicate to the system's control, rendering the security system inoperative. Locating and repairing a break in the polling loop is much simpler than locating and repairing shorts or overloads on the loop, especially when the short or overload manifests itself only when polling loop power and signals are applied to the loop.

Present commercial security systems which use an Ademco polling loop, advertised as Vplex, periodically test the loop to detect a short or overload condition as it may occur somewhere on the loop, but they cannot locate where the trouble condition exists. The control's present reaction is to remove power from the loop and, after some time delay, re-apply power to the loop and re-test for the short or overload condition. The control has no course of action other than report the problem and continue to test the loop until the short or overload condition is removed by a service person.

Locating a Loop Short or Overload

To isolate the location of a short or overload condition on a polling loop requires significant time and effort even for skilled service personnel with suitable testing equipment. This is especially true in very large systems, in which many devices are distributed on the polling loop over several branches and thousands of feet of wire. In order to avoid this eventuality, some installers will "home run" all of the distributed sensors at a site to the inputs of all of their respective Vplex devices concentrated near the control's panel. They do this to facilitate locating and repairing troubled wire run(s) to the sensors. This is an inefficient and costly way of employing the Vplex polling loop system.

In order to properly use the Vplex polling system without concern for shorts or overloads which may occur after installation or in the future, the installer must be given an effective means of locating a short or overload condition no matter where it may occur on the loop.

Using Loop Isolator Modules

Some polling loop systems, such as that employed by Notifier, use relay-based, addressable short detection modules. They are designed to disconnect a shorted branch of the polling loop in order to keep the rest of the polling loop system operational. These modules are explained in the Notifier document, "Intelligent Control Panel SLC Wiring Manual", dated Jul. 25, 2001, Rev C. Each module employs special relay-based short detection circuits and manually-operated rotary switches to identify the address of the affected module and, therefore, the location of the troubled branch or section of the loop. However, the manual does not explain how the proper module disconnects its associated branch on the loop since a short may manifest itself on every device and isolator module throughout the loop.

The Notifier module, which may be similar to other modules used in the Fire/Burglary Industry, requires special circuits, usually including the use of a relay, which must determine that its associated branch is the only branch that has the shorted condition. It must then disconnect its branch from the loop and simultaneously report its switch address to the control to identify the location of the troubled area of the loop.

Such circuits are likely to be expensive if they are to be accurate and dependable in making such a determination. In addition, the circuits must be immune to various disturbances on the loop to prevent unnecessary branch disconnects by any of the modules distributed on the loop.

The relevant prior art known to the inventors at this submission includes: 1. National Semiconductor Spec sheet, LM906 1, "Power MOSFET Driver . . .", April 1995. 2. Scientific Services Laboratory, Short Circuit Isolator, CHQ-SCI-S, August 1999 3. Hochiki SCI-Short Circuit Isolator, DCP-SCI, June 2001. The present invention differs from the prior art of the LM9061 part in that it utilizes a MOSFET device to establish electronic switching that is unlike the method used by the LM9061 part. 2. The CHQ-SCI-S short circuit detection and isolator requires an external intelligent circuit module and is designed to detect only shorts specifically for Class A fire polling loop applications (wherein the detector circuit devices are connected in tandem in a return loop). The present invention does not require intelligent external devices for each isolator device to detect shorts or overloads and is designed primarily for Class B security polling loop systems (wherein the detector circuits are connected in tandem or in parallel in branches that do not include return loops). 3. The DFCP-SCI-S short circuit isolator detects only shorts at initial power up and is used primarily in Class A fire polling loop systems. The present invention detects shorts and overload conditions during and following initial power up and is applied primarily to Class B security polling loop systems.

BRIEF SUMMARY OF THE INVENTION

The present invention provides a Vplex polling loop device which can automatically detect and isolate shorted, or overloaded sections of the polling loop, before or after polling loop power and signaling is switched to the output of the device, permitting normal operation of the remaining portion of the loop. The Vplex short and overload isolator (VSOI) device is usable on former, existing, and future polling loop systems without the need for any software or hardware changes to the associated controls. It is capable of multiple use anywhere on the polling loop while requiring minimum power from the polling loop, and it meets all applicable regulatory agency requirements at a minimum product cost. Finally, in the process of detecting and isolating a short or overload on its output, it prevents that short or overload from sufficiently manifesting itself on its input and, therefore, on the rest of the polling loop, possibly causing other isolating devices to erroneously disconnect their protective branches of the loop.

When power is initially applied to the input side of the VSOI, an internal bi-directional switch is turned OFF for a few milliseconds during which time the output side is electronically tested for complete or resistive shorts. If a short is detected, the switch is maintained OFF and a trouble-indicating LED is illuminated.

If a short is not detected, a uni-directional, current limiting test circuit is turned ON for a time sufficient to test the output side for an overload, powered-on short, or defective polling loop device. If any of these defects occurs, the switch is permanently maintained OFF after the uni-directional test period has expired. The test circuit is made unidirectional to prevent overloads or powered shorts at the output from simultaneously appearing on the input during this test period and, therefore, causing other VSOI units elsewhere on the polling loop to erroneously disconnect their monitored branches.

If no output defect is detected during this powered-on test period, the bi-directional switch is latched ON permitting normal polling loop power and signaling to be applied to the VSOI output. Normal bi-directional connection between the input and output sides of the VSOI is indicated by not illuminating the trouble LED.

If, following normal operation on the polling loop a complete, resistive, overload, or power-on short occurs on the output side of the VSOI, the MOSFET Q4 switch will eventually be turned OFF isolating the defective branch from the rest of the polling loop.

DETAILED DESCRIPTION OF THE INVENTION

The present invention provides a Vplex Short and Overload Isolator (VSOI), which meets all of the above objectives as applied to an Ademco Vplex, or similar polling loop system. Although the following description of the invention for a Short and Overload Isolator (SOI) relates to polling loop applications, such as Vplex polling loops for a Vplex Short and Overload Isolator (VSOI), the SOI is equally applicable to any two-wire, DC-voltage powered, multi-branch, distribution system operating within its voltage and current limits. The SOI is non-addressable and functions independently of control operations. It is restricted to detecting and isolating polling loop branches with complete or resistive shorts, which would ordinarily disable the entire polling loop, or overload conditions resulting from a defective polling device or the connection of too many devices on a given length of cable. A complete short is specified in this design as being <10 ohms.

A resistive short is a complete short separated from the control by cable resistance which can amount to hundreds of ohms, depending on the wire gauge and cable length involved. An overload results from the use of too many polling devices on a given length of cable or from a defective polling loop device.

Figure 2:
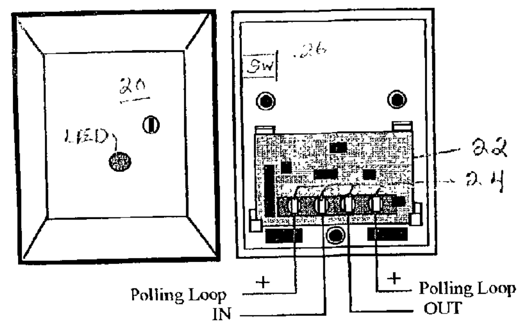
FIG. 2 illustrates an exemplary VSOI product package, wherein the left side shows the unit cover with an LED mounted therein, and the right side shows the PC board and the terminal screw connections to the Vplex polling loop.

FIG. 2 illustrates an exemplary VSOI product package, wherein the left side thereof shows the unit cover 20 with light pipe through which an LED on printed circuit board (PCB) 22 is made visible, and the right side shows PCB 22 and the terminal screw connections 24 to the Vplex polling loop. The VSOI circuits are contained on the small PCB packaged in a small plastic case, as illustrated in FIG. 2, that is normally mounted in visible locations throughout a premises utilizing the polling loop system. It contains four terminal screws 22. Two of the screws 22 connect to the input Polling Loop IN, or control side of the polling loop. The remaining two screws connect to the output Polling Loop OUT, or load side of the polling loop.

The VSOI performs the following unique functions as polling loop power is initially applied to its input and after polling loop power and signaling is applied to its output:

(a) As polling loop power is initially applied to the VSOI input, a bi-directional MOSFET switch (consisting of two MOSFET transistors connected back-to-back), connecting the polling loop input to the polling loop output, is maintained OFF for a few milliseconds while the output side is electronically examined for a possible complete or resistive short. If a short is detected, the MOSFET switch is maintained OFF establishing a disconnected polling loop branch. This condition remains until the short is removed.

(b) If a short is not detected, a unidirectional current limiting test drive circuit is temporarily applied to the output to test for possible overload or device powered-on shorts. This temporary output test feature is made unidirectional to avoid possible powered-on shorts on its output from temporarily appearing on its input during the test period and, therefore, cause other VSOI devices elsewhere on the polling loop to erroneously disconnect their outputs from the polling loop. If an overload or powered-on short is detected, operation of the test drive circuit is terminated and the MOSFET switch is maintained OFF establishing a disconnected polling loop branch. This condition remains until the short is first removed followed by the initial power-on sequence of step (a), above.

(c) If an overload or powered-on short is not detected, the MOSFET switch is turned ON establishing bidirectional connection from its input to its output and full polling loop signaling operation.

Following normal polling loop operation, a complete or resistive short, or overload condition may occur on the polling loop. The VSOI then operates as follows:

I. If a complete short (<10 ohms) occurs, the MOSFET switch will be automatically turned OFF, disconnecting its output from the polling loop until the complete short is removed. When the complete short is removed, the VSOI will automatically turn the MOSFET switch ON re-establishing normal polling loop operation at its output.

II. If a resistive short (between 10 and 900 ohms) occurs, the associated Vplex control will detect this condition and cycle polling loop power OFF and then ON causing an initial power on sequence and a repeat of step (a) as the system control reapplies power to the polling loop after a time delay.

III. If an overload condition occurs, the VSOI will automatically turn its MOSFET OFF disconnecting its output from the polling loop. This condition will remain until the overload condition is removed and an initial power up sequence is repeated, returning the VSOI to step (a) as the system control reapplies power to the polling loop after a time delay.

Whenever the MOSFET switch is turned OFF, a LED is illuminated to identify the VSOI with its output branch disconnected from the polling loop. Otherwise the LED is extinguished to indicate normal polling loop connection established by the VSOI.

Whenever a VSOI causes a permanent break, or electrical disconnection, in one of several branches of a Vplex 2-wire polling loop due to a short or overload detected by the VSOI, the control will fail to communicate with all of the devices located on that disconnected branch. The control will locally enunciate and report failure to communicate to those devices until the affected branch is repaired and proper communication to them is restored. In the meantime, the remaining devices located on the rest of the polling loop will communicate properly with the control establishing partial operation of the security system despite the short or overloaded branch.

The Affect of a Polling Loop Short or Overload

If a short circuit occurs anywhere on the polling loop, the control cannot communicate with any of the devices throughout the polling loop rendering the security system totally inoperative. In addition, a defective Vplex device, or an excessive number of Vplex devices at the end of a significant length of cable, will result in "overload" signal waveforms which are not readable by the control or the Vplex devices. The present invention provides a polling loop device which can automatically detect and isolate shorted, or overload sections of the polling loop while permitting normal operation of the remaining portion of the polling loop.

The short or overload detector and isolator device can also be used as a troubleshooting device by an installer of a Vplex polling loop system by temporarily locating a single VSOI at different locations on the Vplex 2-wire polling loop to determine which section of the loop manifests a short or overload condition on the VSOI output. This would thus replace the use of a multi-meter with which it is difficult to identify harmful resistive shorts or powered-on overloads.

The VSOI may be used in Class B, multi-branch applications without requiring special hardware or software, a new zone type, or any other identification by the existing control.

In some models of Ademco Vplex polling loop systems, for example, a resistive short of ≦900 ohms will disable communication on the entire polling loop. An overload condition not readable by any of these controls and all Vplex devices is one in which the power voltage level of the polling loop signals is below +6 Vdc.

Circuit Description of the VSOI

Figure 1:
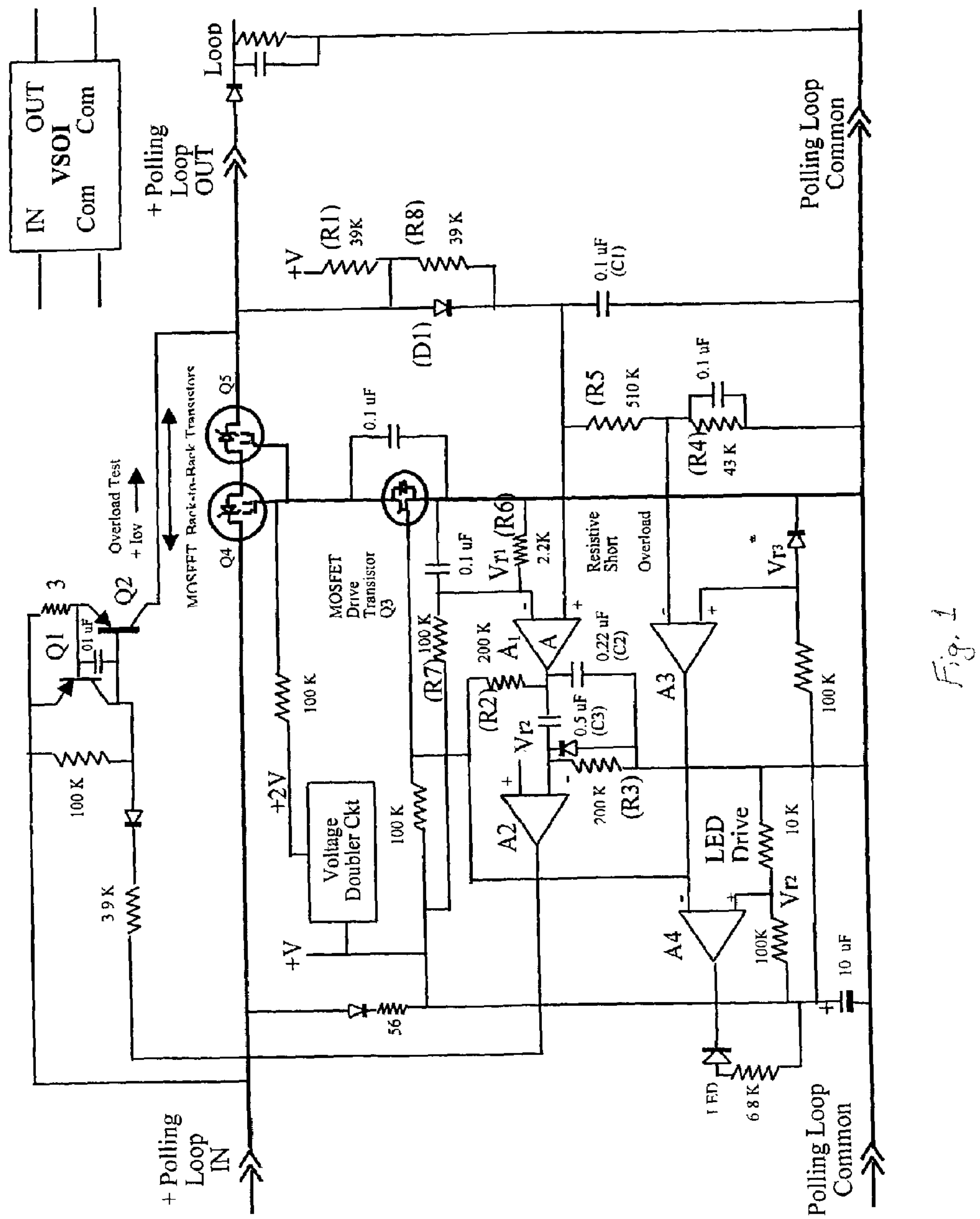
FIG. 1 is a circuit diagram of a Vplex Short and Overload Isolator (VSOI) with proportional short sensing and overload test features.

FIG. 1 is a circuit diagram of a Vplex Overload and Short Isolator (VSOI) with proportional short sensing and overload test features. The upper right portion of FIG. 1 shows the terminal connections to the polling loop.

The VSOI is connected to the polling loop via input terminals labeled+Polling Loop IN and Polling Loop Common, and is connected to Vplex and other circuit devices via output terminals labeled+Polling Loop OUT and Polling Loop Common. The VSOI is not addressable as a Vplex device, and derives its power from the power level of a tri-level signaling polling loop as disclosed and illustrated in U.S. Pat. No. 5,347,515.

The circuit utilizes a uni-directional, current limiting, overload test circuit consisting of Q1 and Q2, and a bidirectional switch circuit comprising a MOSFET drive transistor Q3, bi-directional, low voltage-drop MOSFET transistors Q4 and Q5 connected back-to-back as shown, a commercially available Voltage-Doubler circuit 10 to operate the MOSFET transistors Q4/Q5, and other commonly available circuit components. The VSOI is un-addressable a Vplex device, and so it does not require the use a Vplex ASIC and, therefore, automatically operates as a short and overload detector, and isolator, wherever it is connected on the polling loop in either tandem or parallel configurations.

Basic Operation of the VSOI

When power is initially applied to the input side of the VSOI, DC operating voltage is developed (identified as +V) in the same manner as is done with all Vplex devices. The initial appearance of this voltage also results in the development of twice this voltage (identified as +2V) by the Voltage Doubler circuit, which is needed to operate the MOSFET transistors Q4/Q5 which functions as a closed switch during normal bidirectional Vplex signaling, or otherwise as a bi-directionally open switch to disconnect the output terminals from the input terminals.

As polling loop power is initially applied to the input side of the VSOI, Q3 conducts forcing Q4/Q5 OFF and preventing input polling loop power from initially reaching the output side of the VSOI. Concurrently, the appearance of +V is used to determine if a complete or partial resistive short exists on the output side of the VSOI before polling loop power is switched to the output side. This is accomplished via +V applied to R1, R8 in parallel with D1, integrating capacitor, C1, and the proportional reference voltage, Vr1, on the inverting input of a first voltage comparator circuit, A1. In order for the VSOI to detect the same value of resistive shorts over the full operating range of the VSOI at all locations on the loop (10 Vdc to 14 Vdc for Vplex applications), the reference voltage, Vr1, must vary proportionally with +V. This proportional reference voltage is accomplished via the voltage divider of the 2.2K (R6) and 100 K (R7) resistors from which Vr1 is derived.

Shorts or Overloads During Initial Power Application

If a complete or resistive short (10 ohms to 900 ohms) exists at the output side of the VSOI, the voltage applied to the non-inverting input of the first voltage comparator circuit, A1, will not exceed the value of Vr1 applied to the inverting input of A1. Consequently, A1 will not be activated, preventing subsequent activation of an A2 differentiating circuit. The non-activation of A2 prevents the temporary turning ON of the overload test circuit, Q1/Q2, and the subsequent activation of a second voltage comparator circuit A3. Therefore, Q4/Q5 remains OFF preventing polling loop power at the input side of the VSOI from reaching the polling loop on its output side. This disconnected condition remains as long as the complete or resistive short is present on the output side of the VSOI, thereby isolating the defective branch from the rest of the polling loop located on its input side. In this case, circuit A4 is activated to illuminate the LED to indicate that the associated branch has been disconnected from the rest of the polling loop. An illuminated LED helps a technician locate the VSOI unit involved with the defective branch.

If no resistive short exists at the VSOI output, the voltage applied to the non-inverting input of A1 will exceed the value of Vr1. The first voltage comparator circuit, $A_1$, is thus activated causing the differentiation circuit A2 to conduct for a period of time primarily dictated by differentiating capacitor, C3, resistors R2 and R3, and reference voltage Vr2. Capacitor C2 is needed to bypass a transient activation of A1 resulting from the initial application of power to the comparator circuit.

OverLoad Uni-directional

During this temporary conduction of the differentiation circuit A2, the uni-directional test circuit, Q1/Q2, is turned ON. The resulting ON state of the uni-directional test circuit allows polling loop power to temporarily appear on the output side of the VSOI. This temporary application of power to the output of the VSOI is done in order to determine if an overload condition exists as a result of full power being applied to the Vplex devices of the associated branch. The test circuit must be uni-directional to prevent an initial power short or overload condition from simultaneously appearing on the input side of the VSOI and, therefore, on the entire polling loop. Consequently, a power short or overload at the output of a VSOI is prevented from affecting the operation of other VSOI devices on the polling loop during this temporary application of power to the output at this time.

If no overload condition exists at the VSOI output, the power voltage level of the VSOI output will exceed +6 Vdc. Consequently, the rectified voltage appearing on the inverting input of the second voltage comparator A3, as derived from the voltage divider, R4 and R5, will exceed the forward voltage drop of the reference voltage, Vr3, at its non-inverting input. This results in A3 conducting and permanently turning Q3 OFF and Q4/Q5 ON, effectively latching bi-directional polling loop power from input to output of the VSOI. It should be noted that as A3 conducts, it removes operating voltage from R2 allowing capacitor C3 to return to its initial discharged state. This is done in order to temporarily re-activate the differentiation circuit A2 if A3 is subsequently deactivated due to a short or overload condition originating from a different branch on the polling loop and temporarily appearing on its output. The overload test circuit, Q1/Q2, is disconnected after the temporary activation of the differentiation circuit A2 terminates, leaving only the bi-directional transistors, Q4/Q5, permanently ON. The LED comparator, A4, will not be activated in this case to keep the LED indicator extinguished, indicating a normal loop connection.

However, if the temporary power level appearing at the output of the VSOI is less than the acceptable +6 Vdc, A3 will not conduct maintaining Q3 ON and Q4 OFF. In this instance, bidirectional polling loop power is permanently removed from the associated branch following termination of the temporary application of uni-directional power from the test circuit Q1/Q2. The LED comparator, A4, will remain activated in this case to illuminate the LED and identify the isolated defective branch.

Shorts or Overloads During Normal Operation

If a short, ≦10 ohms, occurs after polling loop power is switched to the output of the VSOI during normal operation of the polling loop, both A1 and A3 voltage comparator circuits will be concurrently deactivated. As A3 is deactivated, Q3 is turned ON and Q4/Q5 turned OFF removing the bi-directional polling loop power connection to its output. Concurrently, operating voltage is reapplied to R2 causing A2 to temporarily activate the uni-directional Q1/Q2 test circuit. If the short is a temporary result of a short appearing elsewhere on the polling loop, the test circuit will succeed in reactivating A3 and permanently restoring bi-directional power to its output. If the short is permanent on its own output, the test circuit will fail to cause A3 to be reactivated, permanently disconnecting its output from the polling loop.

Depending on the cable length separating the VSOI output from the point on the polling loop where a permanent short occurs, a resistive short (typically 10 ohms to 900 ohms) will manifest itself at the output of the VSOI due to the resistance of the cable length involved. This resistive short may not be low enough in value to reduce the polling loop power below the reference voltage, Vr3, to turn off the voltage comparator A3 and permanently open the transistors, Q4/Q5. In such cases, the resistive short will appear everywhere on the polling loop including at the control's polling loop drive circuits.

A resistive short of less than 900 ohms will affect the Vplex polling loop signals by changing Logic 1 levels to Logic 0 levels. Most Ademco controls which support the Vplex polling loop system, recognize this condition as a polling loop short, whereupon, they temporarily remove and restore polling loop power in order to verify the shorted condition and/or to prevent overheating their polling loop driver circuits. This temporary removal and restoration of polling loop power results in a power-on sequence, previously described, in which the VSOI can then detect this resistive short and permanently prevent power from reaching the defective branch. The defective branch is thus isolated from the rest of the polling loop.

OverLoad Uni-directional

If an overload condition results at the output of a VSOI such that the power voltage level drops below +6 Vdc, A3 will deactivate removing the latched power ON condition while causing a temporary activation of the uni-directional test circuit, Q1/Q2. If the overload condition is permanent at the VSOI output, the application of temporary uni-directional power from the test circuit will fail to turn Q4/Q5 ON, thereby permanently disconnecting polling loop power from the defective branch. The defective branch is thus isolated from the rest of the polling loop indicating that a defective Vplex device, or an excessive number of Vplex devices, is located at the output branch of this VSOI.

Polling loop power to this type of defective branch cannot be restored following a power OFF/ON sequence since it would fail the +6 Vdc temporary power ON test, previously described. The control will continue to enunciate the Vplex devices on the defective branch until the overload condition of that branch is repaired.

Application of Unidirectional VSOI Units

Figure 3:
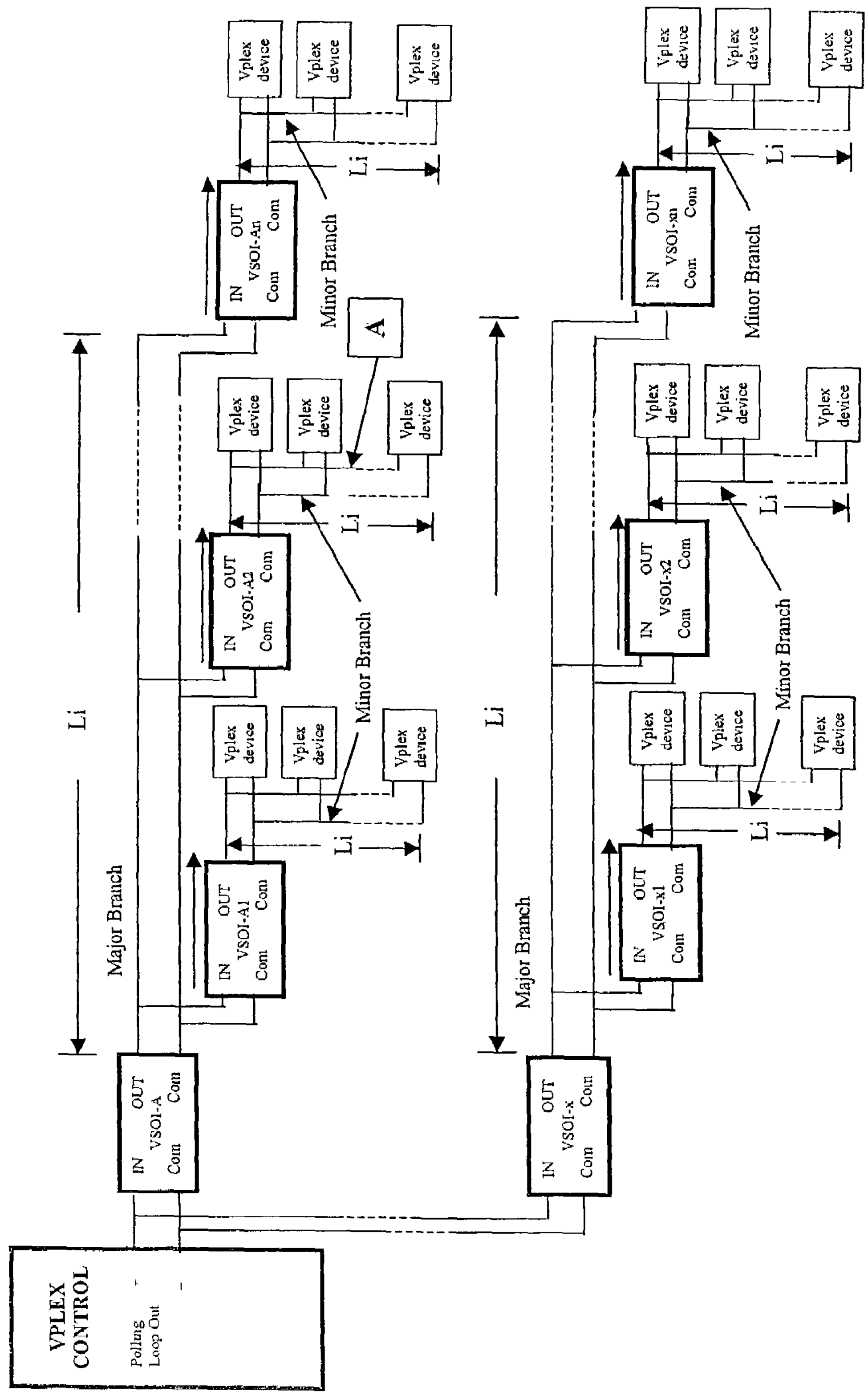
FIG. 3 illustrates an exemplary arrangement of VSOI units distributed on a multi-branch, Class B, Vplex polling loop system.

FIG. 3 illustrates an exemplary way in which a number of unidirectional VSOI units may be used and distributed throughout a Vplex polling loop. In this configuration, each Major Branch is applied through a VSOI device (VSOI-A . . . VSOI-x) physically located near the control panel. Minor Branches, containing Vplex devices, are connected to major branches via additional VSOI devices (VSOI-A1 . . . VSOI-xn) remotely located throughout the polling loop system. Although not shown in the example of FIG. 2, any number of VSOI devices may be connected in tandem or parallel in any major or minor branch.

As power is initially applied to the polling loop, the VSOI devices near the control panel will connect loop power to each of the major branches provided no shorts or overload conditions exist on those major branches.

The major branch power is then applied to all of the remote minor branches provided no shorts or overload conditions exist on any of those minor branches. If no short or overload is encountered by any of the VSOI devices in any of the major or minor branches, polling loop power and normal polling communication between the control panel and all of the Vplex devices will take place.

If a complete short, resistive short, or overload condition is detected by the associated VSOI in any one of the major branches, the VSOI will eventually disconnect that major branch from the rest of the polling loop as described earlier. Similarly, if any of these conditions is detected in, say, branch A of FIG. 2, all Vplex devices in that minor branch will eventually be disconnected from the rest of the polling loop by VSOI-A2. The unidirectional test circuit feature of the VSOI will prevent these defective conditions from simultaneously appearing at its input and, therefore, anywhere else on the polling loop. Consequently, normal polling signals will be applied to all of the remaining Vplex devices via their associated VSOI units on the polling loop.

If a short, <10 ohms, or an overload, ≦6 Vdc, occurs at one or more of the Vplex devices at any of the minor branches subsequent to the application of normal polling signal operation, the previously described disconnect will immediately occur and will be recognized by the control by the loss of communication to the associated disconnected Vplex devices. However, if a short circuit occurs on a minor or major branch that is located from its associated VSOI device by cable length resistance, the resulting resistive short may be insufficient for the VSOI device to disconnect its output from the polling loop. In this case, this resistive short will appear on the entire polling loop including the control's Vplex output drive circuits.

As described earlier, this later condition will result in Vplex polling loop Logic 1 signal levels changing to Logic 0 signal levels. The control will detect this condition as a shorted loop and normally cycle the polling loop power OFF and ON indefinitely until the defective condition is corrected. However, when VSOI devices are located on the polling loop, the cycling of power OFF and then ON results in a power-on sequence, described earlier, causing the VSOI with the resistive short on its branch to immediately disconnect its defective branch from the rest of the loop. The control is then free to communicate properly with all of the Vplex devices on the loop except those disconnected by the VSOI with the defective branch.

Application to New Vplex Polling Loop Systems

Refer to the Vplex Polling Loop Application specifications to determine the maximum cable length allowed, based on the type and gauge of the wire used, and the total device loading per branch. The total device loading must include that contributed by all of the VSOI units used on the loop. (For example, 10 VSOI units will require a total of 12 ma.).

Prepare a site plan and polling loop topology illustrating the location of all of the Vplex devices on each of the main and minor branches of the loop. Refer to the example of FIG. 3.

Begin by locating a VSOI unit at the control panel for every major branch of the loop. Then, locate a VSOI unit at the start of every minor branch containing devices to be isolated from the rest of the polling loop in the event of a short or overload condition occurring on that minor branch.

To ensure that a given VSOI unit will be effective in detecting and isolating shorts and overloads within its specifications, the length of cable separating a given VSOI unit from the Vplex devices located farthest from that VSOI unit should not exceed that presented in Table 1, below.

TABLE 1

| | Maximum Branch Cable Length Between VSOI and Farthest Vplex Devices |
|---|---|
| Wire Gauge | Shielded or Unshielded Cable Length, max. |
| #22 | 1,000 ft. |
| #20 | 1,500 ft. |
| #18 | 2,500 ft. |
| #16 | 4,000 ft. |

The cable lengths of Table 1 are independent of device and capacitive loading per branch and must be considered in conjunction with cable limits derived from the applicable specifications.

As an example, if #18 gauge wire is used in a branch that is loaded with Vplex devices such that not more than 2,000 feet is allowed, a single VSOI may be located at the start of that minor branch since the #18 gauge wire limit is 2,500 ft. However, if 4,000 feet were allowed, devices located beyond the 2,500 ft. limit would not be completely monitored within the VSOI specifications. This may be compensated for by adding another VSOI unit located approximately 2,000 feet from the first VSOI unit in that branch. In this way all of the devices in that 4,000 foot branch would be adequately monitored by both VSOI units.

Application to Existing Vplex Polling Loop Systems

Application to existing, pre-configured Vplex polling loop systems, as in the case of new systems, should begin with a VSOI unit placed at the start of every major branch located at the control panel. In addition, VSOI units may be added in the loop at any point in a given branch or at the start of any minor branch containing Vplex devices that is desired to be monitored In an existing polling loop system that is functioning properly, it is safe to assume that loading and cable lengths used are within the guidelines of the specifications. Therefore, the only remaining guideline required for applying VSOI units to the existing system is that presented in Table 1. There is no limit as to the number of VSOI units that may be added in tandem on a given branch or in separate branches.

For example, consider an existing system having two major branches wherein the farthest Vplex devices are located at approximately 4,000 feet in one branch and 2,000 feet in the second branch. Referring to FIG. 3, to completely monitor all of the devices within VSOI specifications, a VSOI unit should be used at the start of each major branch located at the control panel. If #18 gauge wire were used for both branches, no additional VSOI units would be required for the 2,000 foot branch. The 4,000 foot branch, however, would require one additional VSOI unit located mid-way, or approximately 2,000 feet, from the first VSOI unit at the start of that major branch. In this example, all of the Vplex devices are completely monitored within VSOI specifications since the distance between a VSOI unit and the Vplex devices is less than the specified limit of 2,500 feet for #18 gauge wire (shielded, or unshielded) for both branches.

Figure 4:
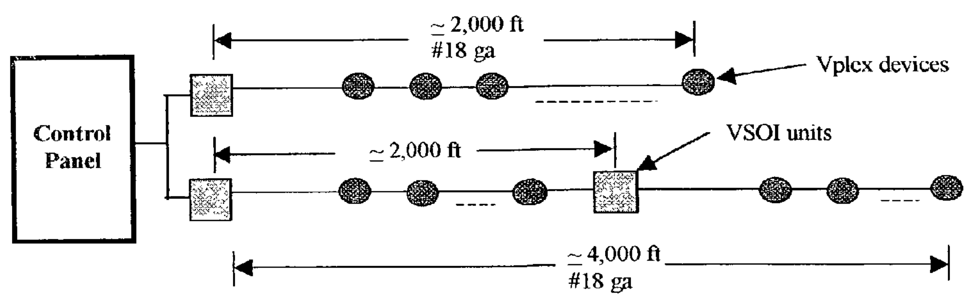
FIG. 4 illustrates the adding of additional VSOI units in tandem to extend complete monitoring of Vplex devices on long cable lengths.

FIG. 4 illustrates the adding of additional VSOI units in tandem in the lower branch to extend complete monitoring of Vplex devices on long cable lengths.

Standard VSOI Features

Detects and isolates complete or resistive shorts, and overload or defective polling loop devices on initial power up or after power and normal polling loop signaling has been switched to its output.

Can be used on any old, present, or future control which supports the Ademco Vplex 2-wire polling loop.

Operates automatically without the need for any special external devices or changes in control H/W or S/W.

Is powered directly from the Vplex 2-wire polling loop.

Any quantity can be placed on any location in any configuration on the polling loop.

Bright LED indicates a disconnected defective branch.

An optional tamper switch 26, FIG. 3, can be added to detect removal of the cover 20 for international applications.

Low Power Consumption

Meets all domestic and international regulatory requirements for commercial systems.

Since operation is automatic without control H/W (hardware) or S/W (software) support, wiring is restricted to Class B configurations.

For best isolation operation, the maximum distance between a VSOI and the polling loop devices located farthest from the VSOI, should be kept within the following wired limits:

1,000 ft., of #22 ga.
1,500 ft., of #20 ga.
2,500 ft., of #18 ga.
4,000 ft., of #16 ga.

Specifications

| | |
|---|---|
| Operating Voltage | (10–14) Vdc for Vplex system |
| Load Current | 1.2 ma, LED off; 3.1 ma, LED on |
| complete short | <10 ohms |
| resistive short | (10–900) ohms |
| overload | <6 Vdc |
| device short or overload | @ (0.6–6.0) Vdc |
| Loop Current | 1 amp, max. |

While several embodiments and variations of the present invention are described in detail herein, it should be apparent that discloses and teachings of the present invention will suggest many alternative designs to those skilled in the art.

What is claimed is:

1. A Short and Overload Isolator (SOI) device, having an input and an output, for detecting and isolating shorted or overloaded sections of a two wire polling loop, comprising:

a. a bi-directional switch connecting the SOI device input to the SOI device output, wherein as polling loop power is initially applied to the SOI device input, the switch is maintained OFF for a time while the SOI device output is electronically tested for a possible complete or resistive short, and if a short is detected, the switch is maintained OFF, establishing a disconnected polling loop branch until the short is removed;

b. a uni-directional drive circuit which, if a short is not detected, is applied to the SOI device output to test for possible overloads or device powered-on shorts, wherein the uni-directional drive circuit avoids possible powered-on shorts on the SOI device output from temporarily appearing on the SOI device input, and if an overload or powered-on short is detected, operation of the drive circuit is terminated and the switch is maintained OFF, establishing a disconnected polling loop branch until the short is removed, and if an overload or powered-on short is not detected, the switch is turned ON, establishing bi-directional connection from the SOI device input to the SOI device output and normal polling loop signaling operation.

2. The SOI device of claim 1, wherein the switch comprises a MOSFET switch circuit.

3. The SOI device of claim 2, wherein the MOSFET switch circuit comprises two MOSFET transistors connected back-to-back.

4. The SOI device of claim 1, wherein following normal polling loop operation, if a complete short occurs, the switch is bi-directionally turned OFF, disconnecting the SOI device output from the polling loop until the complete short is removed, and when the complete short is removed, the SOI device turns the switch ON, re-establishing normal polling loop operation at the SOI device output.

5. The SOI device of claim 1, wherein following normal polling loop operation, if a resistive short occurs, an associated control detects this condition and cycles the polling loop power OFF and then ON, causing an initial power on sequence wherein the switch functions in the same manner as when polling loop power is initially applied to the SOI device input.

6. The SOI device of claim 1, wherein following normal polling loop operation, an overload condition may occur, and if an overload condition occurs, the SOI device turns the switch OFF, disconnecting the SOI device output from the polling loop until the overload condition is removed, followed by an initial power on sequence wherein the switch functions in the same manner as when polling loop power is initially applied to the SOI device input.

7. The SOI device of claim 1, wherein whenever the switch is turned OFF, a LED is illuminated to identify the SOI device with its output disconnected from the polling loop, and otherwise the LED is extinguished to indicate a normal polling loop connection established by the SOI device.

8. The SOI device of claim 1, wherein the SOI device circuits are formed on a printed circuit board packaged in a case with four terminals, wherein two of the terminals connect to the input, or control, side of the polling loop, and two terminals connect to the output, or load, side of the polling loop.

9. The SOI device of claim 1, wherein the uni-directional drive circuit is current limited and comprises first and second transistors.

10. The SOI device of claim 1, wherein the switch comprises a bi-directional, back-to-back MOSFET transistor configuration, a single MOSFET drive transistor, and a voltage-doubler circuit to operate the back-to-back MOSFET transistors, and wherein as polling loop power is initially applied to the SOI device input, the MOSFET drive transistor conducts forcing the back-to-back MOSFET transistors bi-directionally OFF preventing input polling loop power from reaching the SOI device output.

11. The SOI device of claim 1, wherein if a complete or resistive short exists at the SOI device output, a voltage applied to a first input of a first voltage comparator which is developed from the SOI device output will not exceed a reference voltage that is proportional to the applied loop voltage and which is applied to a second input of the first voltage comparator, preventing activation of the first voltage comparator and subsequent activation of a differentiation circuit, preventing a temporary turning ON of the drive circuit, and if no short exists at the SOI device output, the voltage applied to the first input of the first voltage comparator will exceed the value of the proportional reference voltage, activating the first voltage comparator and causing a differentiation circuit to conduct for a pre-determined period of time.

12. The SOI device of claim 11, wherein the differentiation circuit conduction period of time is determined by a differentiating capacitor, first and second resistors and a second reference voltage.

13. The SOI device of claim 11, wherein during the predetermined period of time of conduction of the differentiation circuit, the current limited uni-directional drive circuit is turned ON, causing polling loop power to be temporarily applied to the SOI device output to determine if an overload condition exists as a result of polling loop power being applied through the SOI device to devices of the associated branch.

14. The SOI device of claim 11, wherein if no overload condition exists at the SOI device output, the power voltage level of the SOI device output will exceed a fixed threshold voltage, and a voltage applied to a first input of a second voltage comparator will exceed a reference voltage applied to a second input of the second voltage comparator to turn the switch ON, latching bi-directional polling loop power from input to output of the SOI device, and activation of the second comparator removes an operating voltage from a resistor allowing a capacitor to return to an initial discharged state, to temporarily re-activate the differentiation circuit if the second voltage comparator is subsequently deactivated due to a short or overload condition originating from a different branch on the polling loop and temporarily appearing on its output.

15. The SOI device of claim 12, wherein if a short occurs after polling loop power is switched to the output of the SOI device during normal operation of the polling loop, with the result that a second voltage comparator circuit is deactivated, and deactivation of the second voltage comparator circuit turns the switch OFF, and concurrently an operating voltage is reapplied to a differentiating circuit resistor causing the differentiation circuit to temporarily activate the uni-directional drive circuit, and if the short is a temporary result of a short appearing elsewhere on the polling loop, the drive circuit will reactivate the second voltage comparator and permanently restore bi-directional power to the SOI device output, and if the short is permanent and on its own output, the drive circuit will fail to re-activate the second voltage comparator, permanently disconnecting the SOI device output from the polling loop.

16. The SOI device of claim 1, wherein in the polling loop, the SOI device located physically near a control panel is applied to each major branch of the polling loop, and additional SOI devices remotely located throughout the polling loop connect major branches to minor branches.

17. The SOI device of claim 16, wherein as power is initially applied to the polling loop, the SOI devices near the control panel will connect loop power to each of the major branches provided no shorts or overload conditions exist on the major branches, the major branch power is then applied to all of the remote minor branches provided no shorts or overload conditions exist on any of the minor branches, and if no short or overload is detected by any of the SOI devices in any of the major or minor branches, polling loop power and normal polling communication takes place between the control panel and all of the devices, and if a complete short, resistive short, or overload condition is detected by a SOI device in any one of the major branches, that SOI device associated with that major branch will disconnect that major branch from the rest of the polling loop, and similarly, if a complete short, resistive short, or overload condition is detected in a minor branch the SOI device associated with that minor branch will disconnect that minor branch from the rest of the polling loop.

18. A method of detecting and isolating shorted or overloaded sections of a polling loop by a Short and Overload Isolator (SOI) device having an input and an output which is associated with a branch of the polling loop, which SOI device performs the following steps:

a. as polling loop power is initially applied to the SOI device input, a switch connecting the SOI device input to the SOI device output is maintained OFF for a time while the SOI device output is electronically tested for a possible complete or resistive short, and if a short is detected, the switch is maintained OFF, establishing a disconnected polling loop branch until the short is removed;

b. if a short is not detected, a current limited uni-directional drive circuit is applied to the SOI device output to test for possible overload or device powered-on shorts, wherein the uni-directional circuit avoids possible powered-on shorts on the SOI device output from temporarily appearing on the SOI device input, and if an overload or powered-on short is detected, operation of the drive circuit is terminated and the switch is maintained OFF, establishing a disconnected polling loop branch until the short is removed, and then returning to step a; and c. if an overload or powered-on short is not detected, the switch is turned ON, establishing bi-directional connection from the SOI device input to the SOI device output and normal polling loop signaling operation.

19. The method of claim 18, wherein following normal polling loop operation, if a complete short occurs, the switch is turned OFF, disconnecting the SOI device output from the polling loop until the complete short is removed, and when the complete short is removed, the SOI device turns the switch ON, re-establishing normal polling loop operation at the SOI device output.

20. The method of claim 18, wherein following normal polling loop operation, if a resistive short occurs, an associated control detects this condition and cycles the polling loop power OFF and then ON, causing an initial power on sequence and a repeat of step a.

21. The method of claim 18, wherein following normal polling loop operation, if an overload condition occurs, the SOI device turns the switch OFF, disconnecting the SOI device output from the polling loop until the overload condition is removed, requiring an initial power up sequence and a repeat of step a.

22. The method of claim 18, wherein whenever the switch is turned OFF, a LED is illuminated to identify the SOI device with its output disconnected from the polling loop, and otherwise the LED is OFF to indicate a normal polling loop connection established by the SOI device.

* * * * *